United States Patent
Kim

(10) Patent No.: US 9,236,419 B2
(45) Date of Patent: Jan. 12, 2016

(54) ORGANIC LIGHT EMITTING DISPLAY DEVICE HAVING ELECTRODES OF SUBPIXELS WITH DIFFERENT THICKNESSES AND METHOD OF MANUFACTURING THE SAME

(71) Applicant: LG Display Co., Ltd., Seoul (KR)

(72) Inventor: Chang-Nam Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/096,015

(22) Filed: Dec. 4, 2013

(65) Prior Publication Data

US 2014/0239272 A1    Aug. 28, 2014

(30) Foreign Application Priority Data

Feb. 27, 2013    (KR) ........................ 10-2013-0021041

(51) Int. Cl.
*H01L 27/32*    (2006.01)
*H01L 51/52*    (2006.01)

(52) U.S. Cl.
CPC .......... *H01L 27/322* (2013.01); *H01L 51/5218* (2013.01); *H01L 51/5265* (2013.01); *H01L 27/3244* (2013.01); *H01L 2251/5315* (2013.01)

(58) Field of Classification Search
None
See application file for complete search history.

(56) References Cited

U.S. PATENT DOCUMENTS

| 8,183,069 B2* | 5/2012 | Jung ............................... 438/29 |
| 2006/0214573 A1* | 9/2006 | Maeda et al. ................. 313/506 |
| 2009/0278449 A1 | 11/2009 | Choi et al. |
| 2009/0309108 A1 | 12/2009 | Chang et al. |
| 2012/0299002 A1* | 11/2012 | Kinoshita ....................... 257/59 |
| 2013/0313530 A1* | 11/2013 | Seo et al. ........................ 257/40 |
| 2014/0061595 A1* | 3/2014 | Kim et al. ....................... 257/40 |

FOREIGN PATENT DOCUMENTS

| CN | 1838427 A | 9/2006 |
| CN | 101577289 A | 11/2009 |
| CN | 101604703 A | 12/2009 |
| JP | 2010-272447 A | 12/2010 |

OTHER PUBLICATIONS

Office Action dated Nov. 26, 2015, issued by the Chinese Patent Office in Chinese Patent Application No. 201310704676.4.

* cited by examiner

*Primary Examiner* — Michael Jung
(74) *Attorney, Agent, or Firm* — Morgan, Lewis & Bockius LLP

(57) ABSTRACT

An organic light emitting display device and a method of manufacturing the same are provided. The organic light emitting display device includes a substrate including red, green, and blue sub-pixel regions, reflective electrodes on the substrate, a reflective protective film on the substrate and surrounding sides and front surfaces of each reflective electrode, the reflective electrodes being on the reflective protective film, first electrodes on the substrate, the reflective protective film being on the first electrodes, the first electrodes including different respective thicknesses in the respective red, green, and blue sub-pixel regions, a second electrode facing the first electrodes, and a white organic common layer between the first and second electrodes.

16 Claims, 16 Drawing Sheets

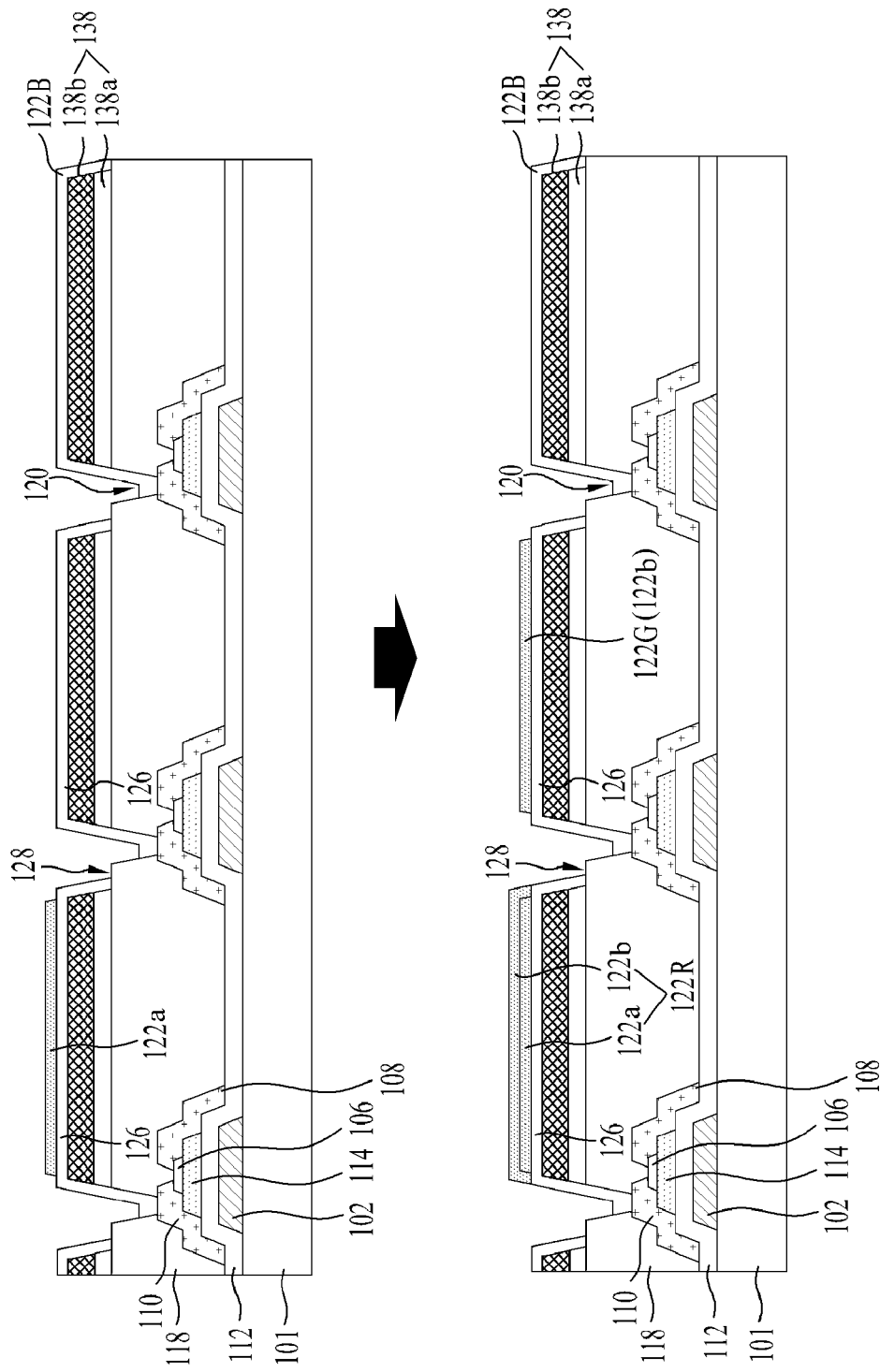

ORGANIC LIGHT EMITTING DISPLAY DEVICE HAVING ELECTRODES OF SUBPIXELS WITH DIFFERENT THICKNESSES AND METHOD OF MANUFACTURING THE SAME

CROSS-REFERENCE TO RELATED APPLICATION(S)

This application claims the benefit under 35 U.S.C. §119(a) of Korean Patent Application No. 10-2013-0021041, filed on Feb. 27, 2013, in the Korean Intellectual Property Office, the entire disclosure of which is incorporated by reference herein for all purposes.

BACKGROUND

1. Technical Field

The following description relates to an organic light emitting display device and a method of manufacturing the same, and, more particularly, to an organic light emitting display device with high resolution and a method of manufacturing the same.

2. Discussion of the Related Art

Image display devices, which display a variety of information on a screen, are a core technology of information and communication and are becoming increasingly thinner, lighter, more portable, and higher in performance. Thus, organic light emitting diode (OLED) display devices, which display an image by controlling light emission of an organic emission layer (EML), have received attention as a flat panel display device that may address problems in terms of weight and volume associated with cathode ray tubes (CRTs).

Such OLED display devices include sub-pixels each consisting of an anode and a cathode facing each other, with an EML disposed therebetween. In these OLED display devices, holes injected from the anode and electrons injected from the cathode are recombined in the EML, forming excitons, which are hole-electron pairs, and light is emitted when the excitons return to a ground state.

Conventional OLED display devices include red, green, and blue sub-pixels respectively including red, green, and blue organic EMLs between first and second electrodes. The red, green, and blue organic EMLs are formed through a deposition process using a shadow mask. In this case, EMLs realizing different colors must be spaced apart from each other by a predetermined distance, thus hindering an increase in resolution due to limitations in increasing the resolution of the shadow mask.

SUMMARY

Accordingly, embodiments of the present application are directed to an organic light emitting display device and a method of manufacturing the same that substantially obviates one or more problems due to the limitations and disadvantages of the related art.

An object of embodiments is to provide an organic light emitting display device with high resolution and a method of manufacturing the same.

Advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to one aspect of the invention, there is provided an organic light emitting display device, including: a substrate including red, green, and blue sub-pixel regions, reflective electrodes on the substrate, a reflective protective film on the substrate and surrounding sides and front surfaces of each reflective electrode, the reflective electrodes being on the reflective protective film, first electrodes on the substrate, the reflective protective film being on the first electrodes, the first electrodes including different respective thicknesses in the respective red, green, and blue sub-pixel regions, a second electrode facing the first electrodes, and a white organic common layer between the first and second electrodes.

In another aspect, there is provided a method of manufacturing an organic light emitting display device, the method including: forming reflective electrodes on a substrate including red, green, and blue sub-pixel regions, forming a reflective protective film on the substrate, the reflective electrodes being formed on the reflective protective film, the reflective electrodes surrounding side and front surfaces of each reflective electrode, forming, on the substrate with the reflective protective film formed thereon, first electrodes including different thicknesses in the respective red, green, and blue sub-pixel regions, forming a white organic common layer on the first electrodes, and forming a second electrode on the white organic common layer.

It is to be understood that both the foregoing general description and the following detailed description are examples and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

FIGS. 5A to 5C are sectional views for explaining a method of manufacturing the organic light emitting display device illustrated in FIG. 4.

Figure 1:
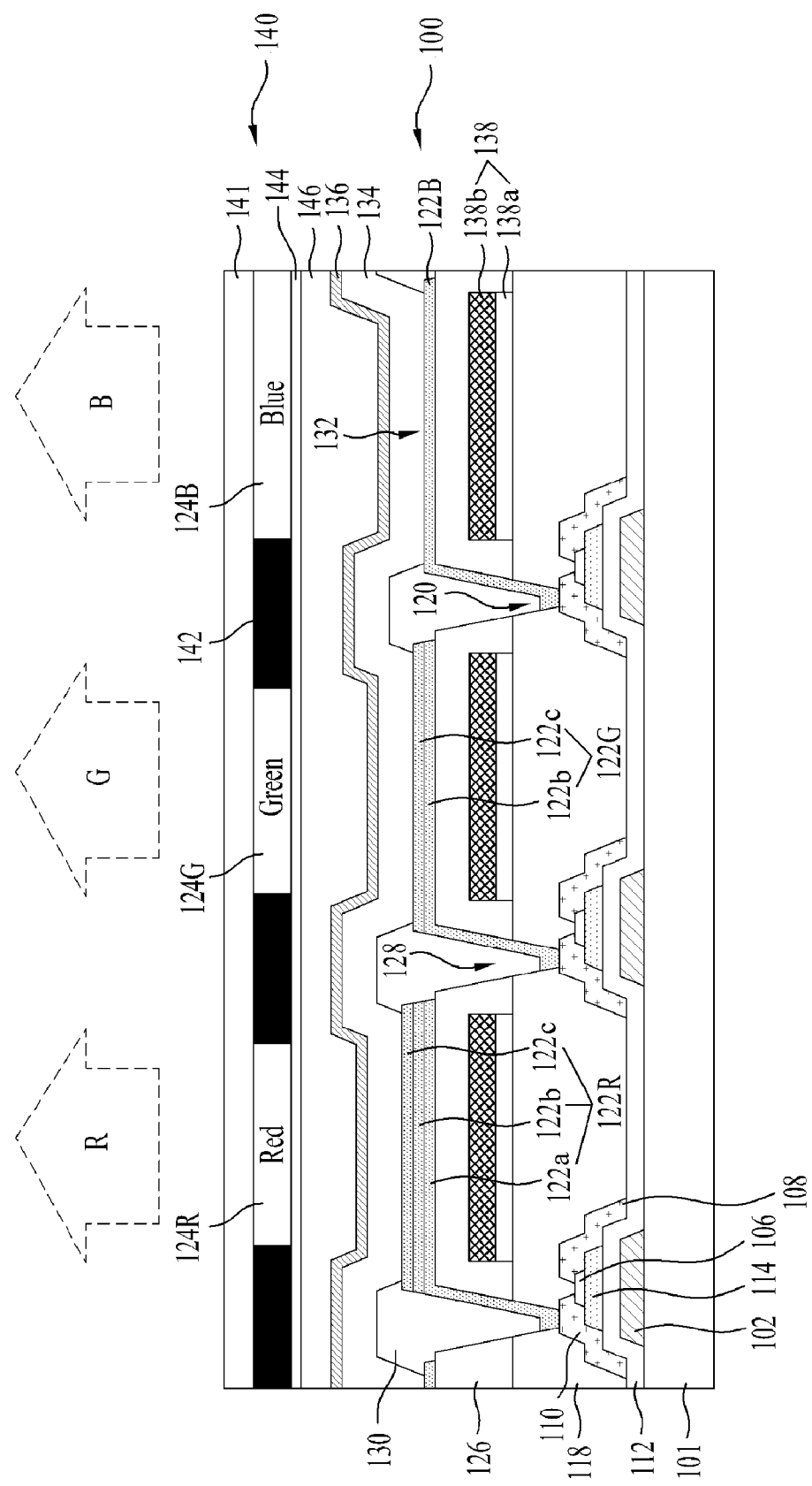
FIG. 1 is a sectional view of an organic light emitting display device according to an embodiment.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Hereinafter, embodiments will be described in detail with reference to the accompanying drawings.

FIG. 1 is a sectional view of an organic light emitting display device according to an embodiment.

With reference to FIG. 1, the organic light emitting display device according to an embodiment may include a light emitting substrate 100 and an encapsulation substrate 140 adhered to the light emitting substrate 100 via an adhesive resin layer 144.

Figure 2:
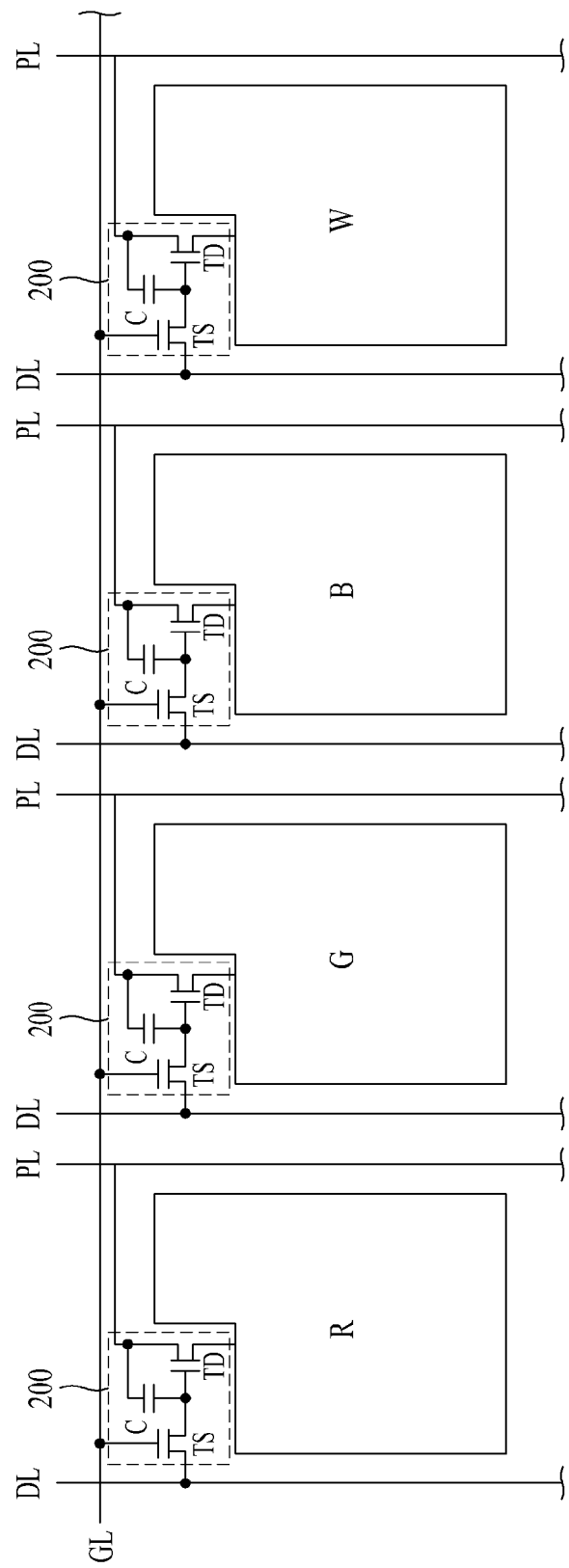
FIG. 2 is a view for explaining a unit pixel of the organic light emitting display device illustrated in FIG. 1.

The light emitting substrate 100 may include, as illustrated in FIG. 2, a plurality of sub-pixel regions defined by intersections of gate lines (GL), data lines (DL), and power lines (PL).

The sub-pixel regions may include red (R) sub-pixel regions, green (G) sub-pixel regions, and blue (B) sub-pixel regions, and the R, G, and B sub-pixel regions may be arranged in the form of a matrix to display an image. The sub-pixel regions may also include white (W) sub-pixel regions, which may be included in the matrix.

Each of the R, G, and B sub-pixel regions may include a cell driving unit 200 and an organic light emitting cell connected to the cell driving unit 200.

The cell driving unit 200 may include a switch thin film transistor TS (connected to a gate line GL and a data line DL), a driving thin film transistor TD (connected to the switch thin film transistor TS, a power line PL, and a first electrode 122 of an organic light emitting diode (OLED)), and a storage capacitor C (connected to the power line PL and a drain electrode 110 of the switch thin film transistor TS).

A gate electrode of the switch thin film transistor TS may be connected to the gate line GL, a source electrode thereof may be connected to the data line DL, and a drain electrode thereof may be connected to a gate electrode of the driving thin film transistor TD and the storage capacitor C. A source electrode of the driving thin film transistor TD may be connected to the power line PL, and a drain electrode 110 thereof may be connected to the first electrode 122. The storage capacitor C may be connected between the power line PL and the gate electrode of the driving thin film transistor TD.

The switch thin film transistor TS may be turned on in response to a scan pulse being supplied to the gate line GL, and a data signal supplied to the data line DL may be supplied to the storage capacitor C and the gate electrode of the driving thin film transistor TD. The driving thin film transistor TD may control a current (I) supplied from the power line PL to the OLED in response to the data signal supplied to the gate electrode, and may adjust light emission of the OLED. In addition, even if the switch thin film transistor TS is turned off, the driving thin film transistor TD may supply a constant current (I) until a data signal of the next frame is supplied, due to voltage charged in the storage capacitor C, and the OLED may therefore continue to emit light.

As illustrated in FIG. 2, the driving thin film transistor TD may be connected to the gate line GL and may include a gate electrode 102 formed on a lower substrate 101, a gate insulating film 112 formed on the gate electrode 102, an oxide semiconductor layer 114 formed to correspond to the gate electrode 102 (with the gate insulating film 112 disposed therebetween), an etch stopper 106 formed on the oxide semiconductor layer 114 to prevent damage to the oxide semiconductor layer 114 and to protect the oxide semiconductor layer 114 from oxygen, a source electrode 108 connected to the data line DL, and the drain electrode 110 facing the source electrode 108. In addition, an organic passivation film 118 formed of an organic insulating material may be formed on the driving thin film transistor TD to planarize the lower substrate 101 with the driving thin film transistor TD formed thereon.

In one embodiment, a passivation film on the driving thin film transistor TD may have a double-layer structure including an inorganic passivation film including, e.g., an inorganic insulating material and an organic passivation film including, e.g., an organic insulating material. The oxide semiconductor layer 114 may be formed of an oxide including at least one metal selected from, for example, Zn, Cd, Ga, In, Sn, Hf, and/or Zr. A thin film transistor including the oxide semiconductor layer 114 may have higher charge mobility and lower leakage current than a thin film transistor including a silicon semiconductor layer. In addition, the thin film transistor including a silicon semiconductor layer may be manufactured through a high-temperature manufacturing process and may be subjected to a crystallization process. When the thin film transistor is fabricated over a large area, uniformity may be deteriorated during the manufacturing process, which may make it difficult to fabricate a large-area thin film transistor. By contrast, the thin film transistor including the oxide semiconductor layer 114 may be manufactured through a low-temperature manufacturing process and may be better suited to large-area fabrication than one without the oxide semiconductor layer 114.

The light emitting cell may include the first electrode 122 connected to the drain electrode 110 of the driving thin film transistor TD, a bank insulating film 130 provided with bank holes 132 to expose the first electrode 122, an organic common layer 134 formed on the first electrode 122, and a second electrode 136 formed on the organic common layer 134. The organic common layer 134 may include, on the first electrodes 122, a hole-related layer, an emission layer (EML), and an electron-related layer (described in descending or reverse order of formation). The organic common layer 134 may be formed within the bank holes 132 of the bank insulating film 130 formed to define light emitting regions, and may emit white light.

The first electrodes 122 as an anode may be formed to different thicknesses in the respective R, G, and B sub-pixels. That is, in one example, a first electrode 122R of the R sub-pixel may have a first thickness, a first electrode 122G of the G sub-pixel may have a second thickness that is smaller than the first thickness, and a first electrode 122B of the B sub-pixel may have a third thickness that is smaller than the second thickness.

For this example configuration, the first electrode 122R of the R sub-pixel region may have a stacked structure including first, second, and third transparent conductive layers 122a, 122b, and 122c; the first electrode 122G of the G sub-pixel region may have a double-layer structure including two of the first, second, and third transparent conductive layers 122a, 122*b*, and 122*c*; and the first electrode 122B of the B sub-pixel region may have a single structure including one of the first, second, and third transparent conductive layers 122*a*, 122*b*, and 122*c*. In FIG. 1, an example in which the first electrode 122G of the G sub-pixel has a stacked structure including the second and third transparent conductive layers 122*b* and 122*c*, and the first electrode 122B of the B sub-pixel includes the third transparent conductive layer 122*c* is illustrated. Because the first electrodes 122 may be formed to have different thicknesses in the respective R, G, and B sub-pixels, a reflective electrode 138 of the R sub-pixel region may be most distant from the second electrode 136, a reflective electrode 138 of the B sub-pixel region may be the nearest from the second electrode 136, and a reflective electrode 138 of the G sub-pixel region may have a middle distance from the second electrode 136. That is, the R sub-pixel may have the greatest micro-cavity length, the B sub-pixel may have the smallest micro-cavity length, and the G sub-pixel may have a micro-cavity length in between the R and B sub-pixels. Accordingly, luminous efficiency of each sub-pixel may be optimized due to constructive interference of light emitted from the respective sub-pixels, and power consumption may be reduced.

The second electrode 136 as a cathode may have a single layer structure or a multilayer structure and may serve as a semi-transparent electrode. For this configuration, each layer of the second electrode 136 may be formed of, for example, a metal, an inorganic material, a mixture of metals, a mixture of a metal and an inorganic material, or a mixture thereof. In this regard, when each layer is formed of a mixture of a metal and an inorganic material, a ratio of the metal to the inorganic material may be between 10:1 and 1:10. In addition, when each layer is formed of a mixture of metals, a ratio thereof may be between 10:1 and 1:10. The second electrode 136 may be formed of a metal, such as Ag, Mg, Yb, Li, and/or Ca; and/or an inorganic material, such as $Li_2O$, CaO, LiF, and/or $MgF_2$, which may assist electron movement and may enable a large amount of electrons to be supplied to an EML.

In the organic light emitting cell, in response to voltage being applied between the first electrode 122 and the second electrode 136, holes injected from the first electrode 122 and electrons injected from the second electrode 136 may be recombined in the EML, forming excitons. The excitons may return to a ground state, and light may be emitted.

The reflective electrode 138 may have a multilayer structure including a reflective layer 138*b* formed of, for example, Al or an Al alloy (e.g., AlNd) and a transparent layer 138*a* formed of, for example, indium tin oxide (ITO), indium zinc oxide (IZO), or the like. The reflective electrode 138 may serve to reflect white light emitted from the organic common layer 134 (that would otherwise proceed towards the lower substrate 101) towards color filters 124R, 124G, and 124B. Instead of the conductive reflective electrode 138, a non-conductive reflective film may be formed.

A multi-protective film 146 may prevent permeation of external moisture or oxygen, enhancing reliability. For this operation, the multi-protective film 146 may have a structure in which organic layers and inorganic layers may be alternately arranged with respect to each other repeatedly. The inorganic layers may be formed of, for example, at least one of aluminum oxide ($Al_xO_x$), silicon oxide ($SiO_x$), $SiN_x$, SiON, and/or LiF, which may prevent permeation of external moisture or oxygen. The organic layers may also prevent permeation of external moisture or oxygen. In addition, the organic layers may alleviate stress between the layers due to bending of the organic light emitting display device and may enhance planarization performance. Such organic layers may be formed, for example, of a polymer, such as an acryl-based resin, an epoxy-based resin, polyimide, polyethylene, or the like.

A reflective protective film 126 may be formed to surround the reflective electrodes 138 and may prevent damage to the reflective electrodes 138 by an etchant or etching gas used in an etching process of the first electrode 122. The reflective protective film 126 may be formed of an insulating material, for example, an inorganic compound (such as $SiN_x$ and/or $SiO_2$) or a metallic compound (such as $Al_2O_3$). In this regard, the reflective protective film 126 may have openings 128 with a width that may be equal to or greater than that of the pixel contact holes 120. Each opening 128 may be connected to the pixel contact hole 120 to expose the drain electrode 110. That is, the reflective protective film 126 may be formed in the remaining regions excluding regions where the openings 128 formed corresponding to the pixel contact holes 120 are formed, and may have the same pattern as that of a planarization layer 118. In addition, the reflective protective film 126 may have a transmissivity of 85% or greater at a wavelength of 455 nm and may prevent deterioration in transmissivity.

The encapsulation substrate 140 may include black matrices 142 and color filters 124R, 124G, and 124B on an upper substrate 141. The black matrices 142 and color filters 124R, 124G, and 124B may be alternately formed as a single layer. Alternatively, the black matrices 142 may be formed on the upper substrate 141, and the color filters may be formed on the upper substrate with the black matrices 142 formed thereon.

The color filters 124R, 124G, and 124B may include R, G, and B color filters 124R, 124G, and 124B. The R color filter 124R may be formed on the upper substrate 141 in the R sub-pixel region and may emit red light. The G color filter 124G may be formed on the upper substrate 141 in the G sub-pixel region and may emit green light. The B color filter 124B may be formed on the upper substrate 141 in the B sub-pixel region and may emit blue light.

The black matrices 142 may be formed between the R, G, and B color filters 124R, 124G, and 124B to prevent mixing of colors of adjacent color filters and to absorb external light.

As such, according to an embodiment, the first electrodes 122 of the respective R, G, and B sub-pixels may have different thicknesses and luminous efficiency may be enhanced, which may result in reduced power consumption. In addition, the reflective protective film 126 may be formed to surround the reflective electrodes 138 and damage to the reflective electrodes 138 may be prevented when the first electrodes 122 having a multilayer structure are formed through etching.

FIGS. 3A to 3J are sectional views illustrating a method of manufacturing the organic light emitting display device illustrated in FIG. 1.

Figure 3A:
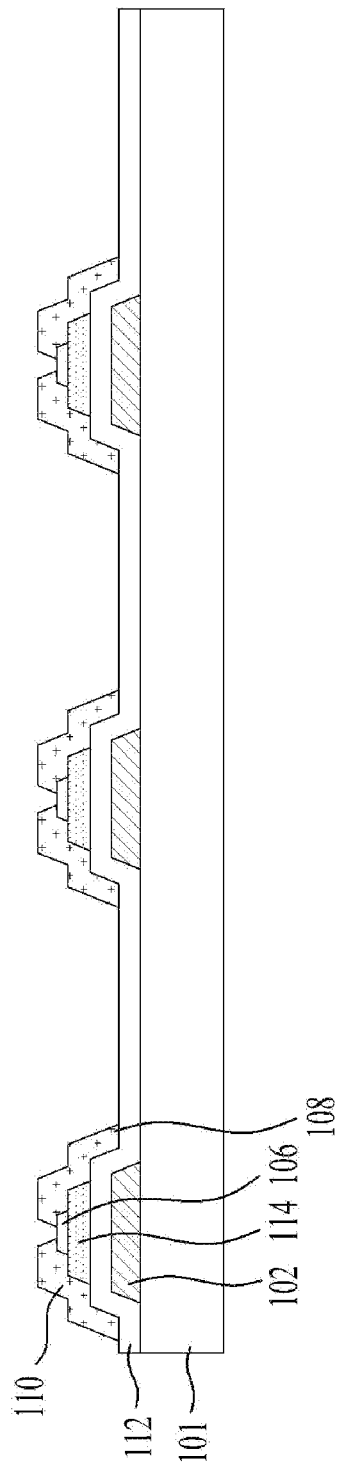
FIGS. 3A to 3J are sectional views illustrating a method of manufacturing the organic light emitting display device illustrated in FIG. 1.

With reference to FIG. 3A, a driving thin film transistor may be formed on the lower substrate 101. The driving thin film transistor may include the gate electrode 102, the gate insulating film 112, semiconductor patterns 114 and 106, i.e., an oxide semiconductor layer 114 and an etch stopper layer 106, the source electrode 108, and the drain electrode 110.

For example, a gate metal layer may be formed on the lower substrate 101 through deposition, such as sputtering or the like. The gate metal layer may be formed of a metal, such as Mo, Ti, Cu, AlNd, Al, Cr, an Mo alloy, a Cu alloy, an Al alloy, a Mo—Ti alloy, or the like. Subsequently, the gate metal layer may be patterned by photolithography and etching to form the gate electrodes 102.

Next, the gate insulating film 112 including an inorganic insulating material, such as $SiO_x$, $SiN_x$, or the like, may be formed over the entire surface of the lower substrate 101 with the gate electrodes 102 formed thereon. Then, the oxide semiconductor layer 114 and the etch stopper layer 106 may be sequentially formed on the lower substrate 101 with the gate insulating film 112 formed thereon through photolithography and etching.

Thereafter, a data metal layer may be formed on the lower substrate 101 with the semiconductor patterns 114 and 106 formed thereon through deposition such as sputtering or the like. In this regard, the data metal layer may be formed, for example, of titanium (Ti), tungsten (W), an aluminum (Al)-based metal, molybdenum (Mo), copper (Cu), or the like. Subsequently, the data metal layer may be patterned by photolithography and etching to form the source electrode 108 and the drain electrode 110.

Figure 3B:
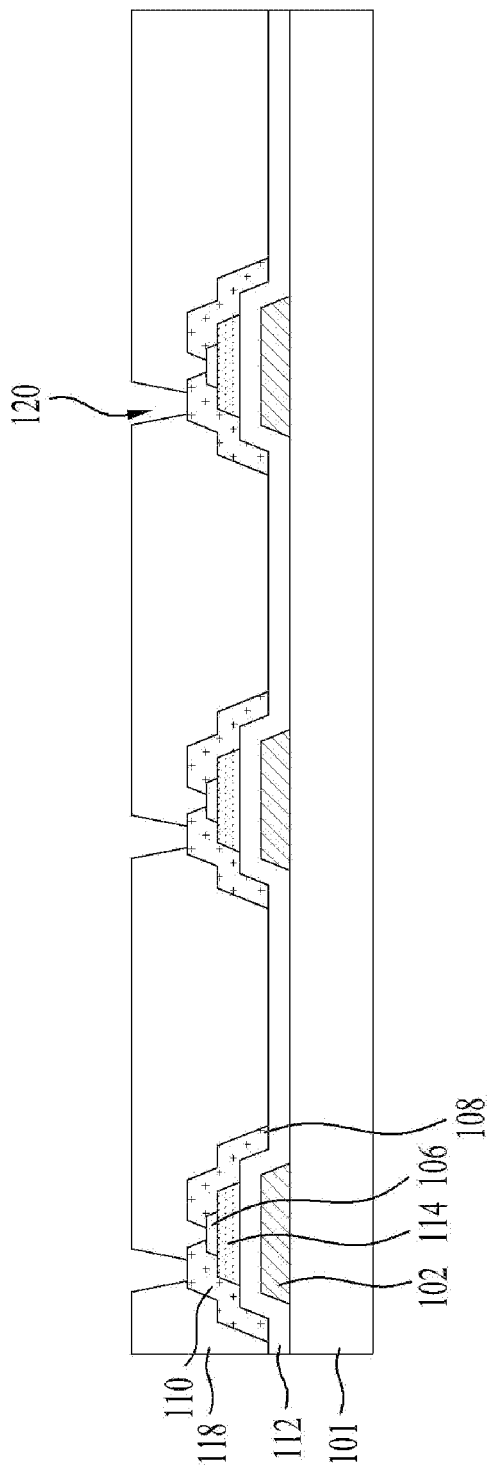

With reference to FIG. 3B, the planarization layer 118 having pixel contact holes 120 may be formed on the lower substrate 101 with the source and drain electrodes 108 and 110 formed thereon. For example, a photosensitive organic film formed of an acryl-based resin may be formed as the planarization layer 118 on the lower substrate 101 with the source and drain electrodes 108 and 110 formed thereon. Subsequently, the planarization layer 118 may be patterned by photolithography and etching to form the pixel contact holes 120. Each pixel contact hole 120 may expose the drain electrode 110 of the driving thin film transistor in the corresponding sub-pixel region.

Figure 3C:
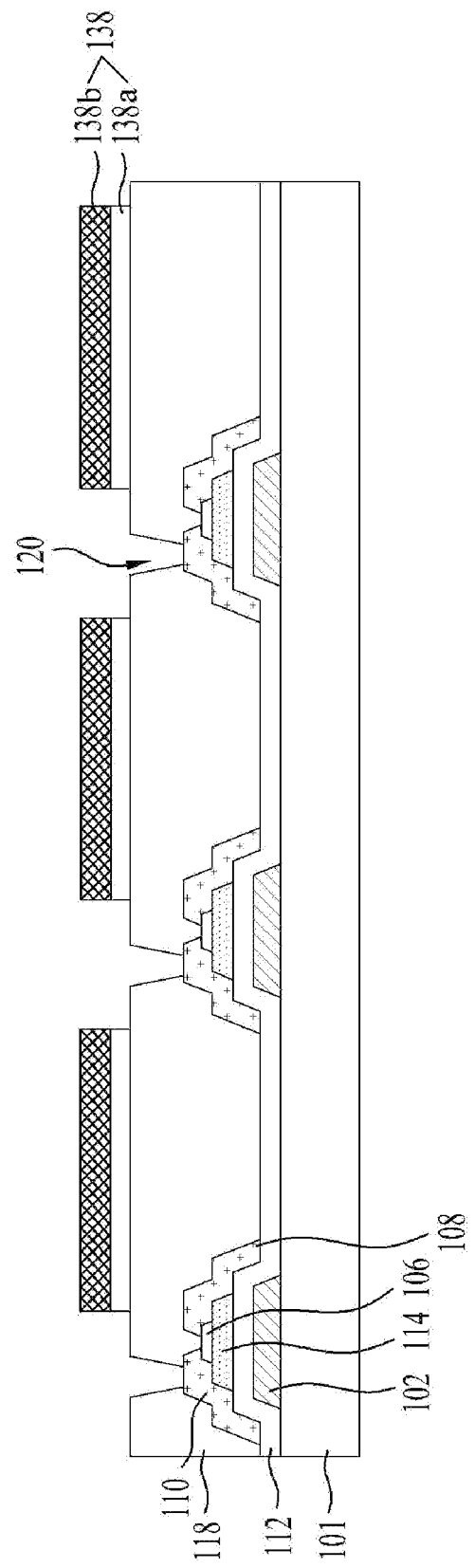

With reference to FIG. 3C, the reflective electrodes 138 may be formed on the lower substrate 101 with the planarization layer 118 having the pixel contact holes 120 formed thereon. For example, the transparent layer 138a and the reflective layer 138b may be sequentially stacked on the lower substrate 101 with the planarization layer 118 having the pixel contact holes 120 formed thereon. Then, the transparent layer 138a and the reflective layer 138b may be simultaneously patterned by photolithography and etching that use the same mask to form the reflective electrodes 138 each including the transparent layer 138a and the reflective layer 138b that have the same pattern.

Figure 3D:
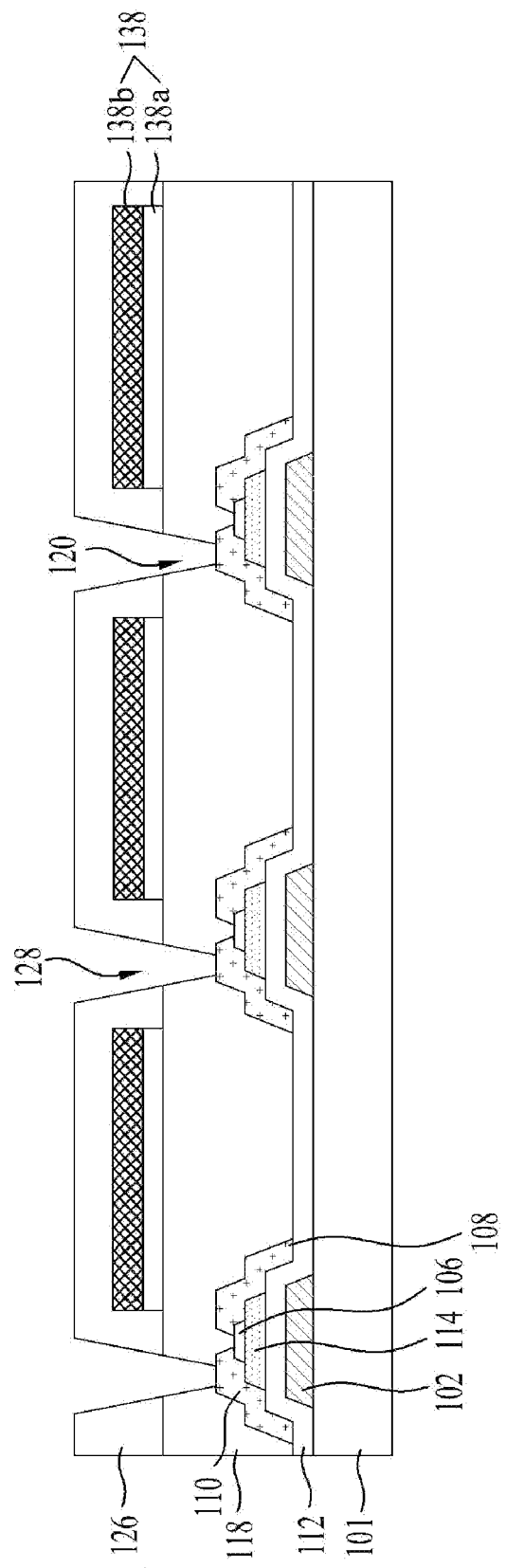

With reference to FIG. 3D, the reflective protective film 126 may be formed on the lower substrate 101 with the reflective electrodes 138 formed thereon. For example, a reflective protective material may be deposited over the entire surface of the lower substrate 101 with the reflective electrodes 138 formed thereon. In this regard, the reflective protective material may be, for example, an inorganic compound, such as $SiN_x$ and/or $SiO_2$, or a metallic compound, such as $Al_2O_3$. Thereafter, the reflective protective material may be patterned by photolithography and etching to form the reflective protective film 126. The reflective protective film 126 may have a greater width than that of the reflective electrodes 138 and may be formed to surround front and side surfaces of each reflective electrode 138.

Although an example in which the pixel contact holes 120 and the openings 128 are formed by patterning using different masks has been described, the pixel contact holes 120 and the openings 128 may be simultaneously formed by patterning using the same mask. That is, the pixel contact holes 120 may not be formed in the process illustrated in FIG. 3B; and in the process illustrated in FIG. 3D, the pixel contact holes 120 and the openings 128 may be simultaneously formed by etching the planarization layer 118 using, as a mask, a photoresist pattern used to pattern the openings 128.

Figure 3E:
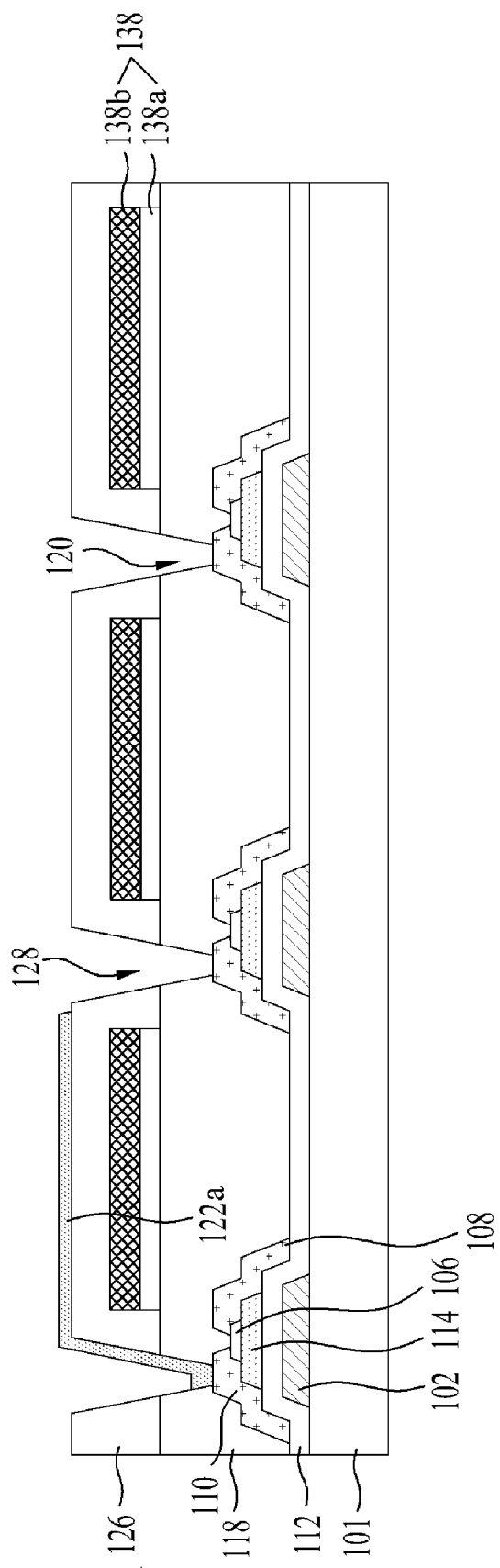

With reference to FIG. 3E, a first transparent conductive layer 122a of the R sub-pixel region may be formed on the lower substrate 101 with the reflective protective film 126 formed thereon. For example, a first transparent conductive material, such as ITO, IZO, or the like, may be deposited on the lower substrate 101 with the reflective protective film 126 formed thereon through deposition, such as sputtering or the like. Subsequently, the first transparent conductive material may be patterned by photolithography and etching to form the first transparent conductive layer 122a of the R sub-pixel region.

Figure 3F:
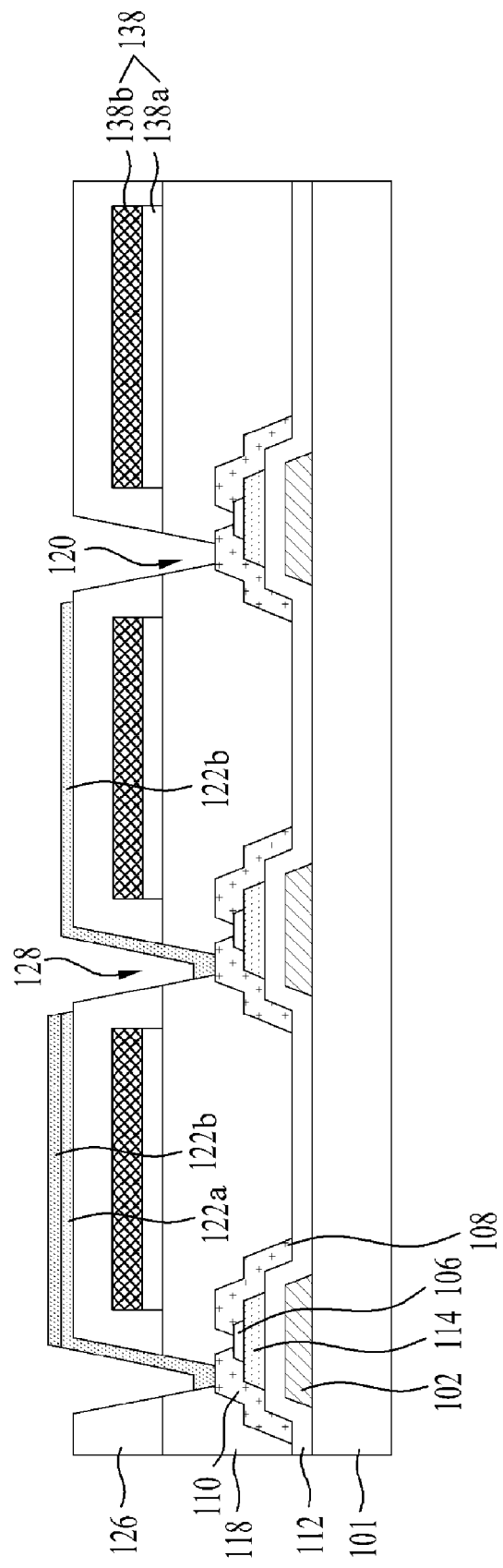

With reference to FIG. 3F, a second transparent conductive layer 122b of the first electrode 122 of each of the R and G sub-pixel regions may be formed on the lower substrate 101 with the first transparent conductive layer 122a of the R sub-pixel region formed thereon. For example, a second transparent conductive material, such as ITO, IZO, or the like may be deposited on the lower substrate 101 with the first transparent conductive layer 122a of the R sub-pixel region formed thereon, through deposition, such as sputtering or the like. Subsequently, the second transparent conductive material may be patterned by photolithography and etching to form the second transparent conductive layer 122b of each of the R and G sub-pixel regions.

Figure 3G:
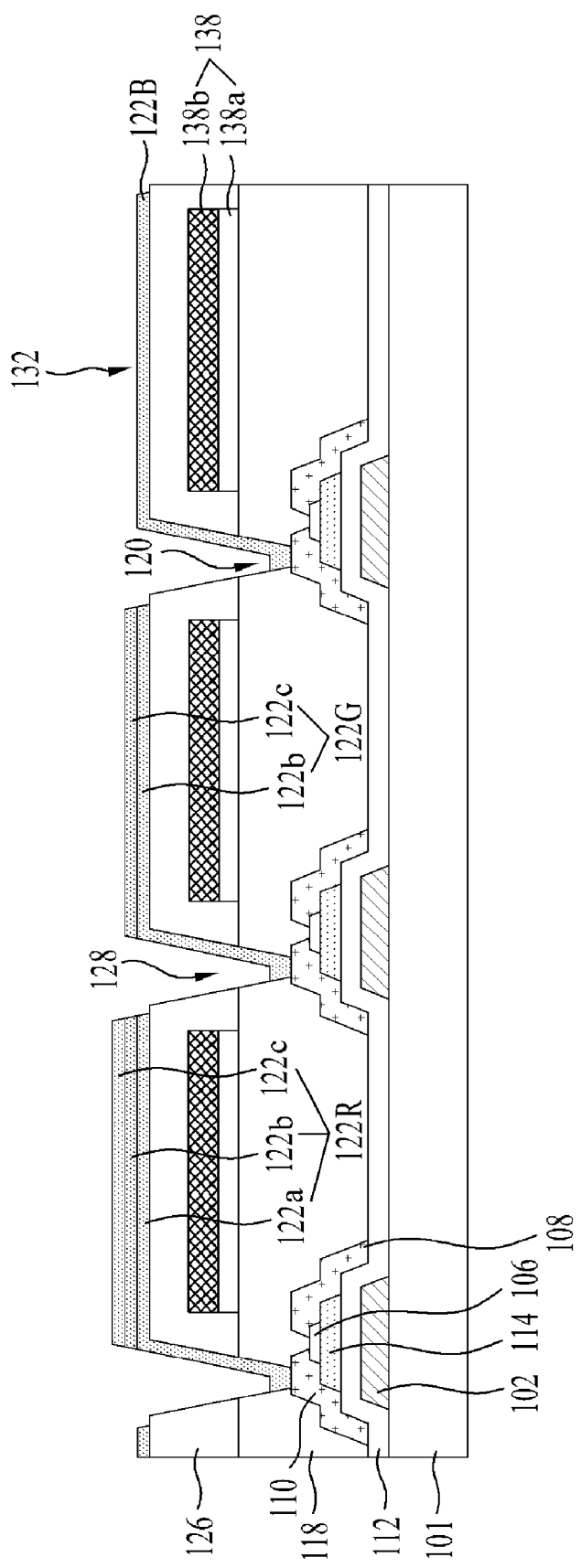

With reference to FIG. 3G, the third transparent conductive layer 122c of each of the R, G, and B sub-pixel regions may be formed on the lower substrate 101 with the second transparent conductive layer 122b of each of the R and G sub-pixel regions formed thereon. For example, a third transparent conductive material, such as ITO, IZO, or the like may be deposited on the lower substrate 101 with the second transparent conductive layer 122b of each of the R and G sub-pixel regions formed thereon, through deposition, such as sputtering or the like. Subsequently, the third transparent conductive material may be patterned by photolithography and etching to form the third transparent conductive layers 122c. Accordingly, the first electrode 122R including the first, second, and third transparent conductive layers 122a, 122b, 122c may be formed in the R sub-pixel region, the first electrode 122G including the second and third transparent conductive layers 122b and 122c may be formed in the G sub-pixel region, and the first electrode 122B including the third transparent conductive layer 122c may be formed in the B sub-pixel region. The first, second, and third transparent conductive layers 122a, 122b, 122c may be formed of a same material, although embodiments are not limited thereto.

Figure 3H:
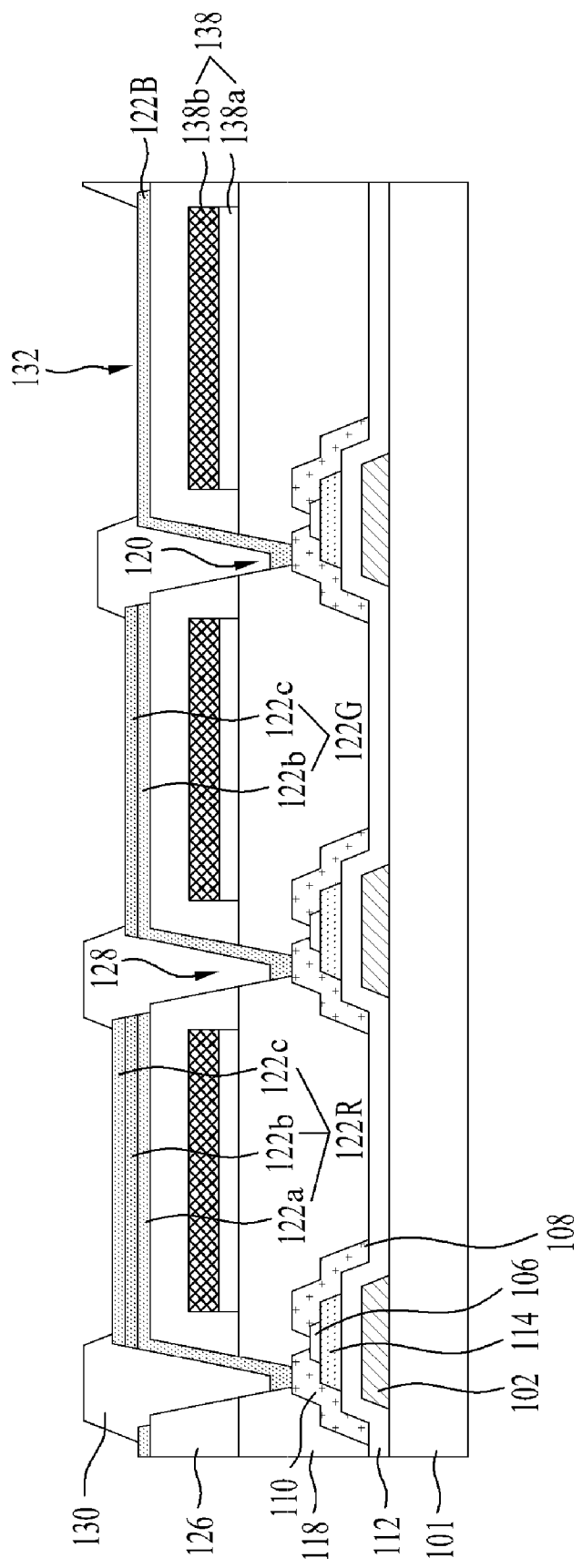

With reference to FIG. 3H, the bank insulating film 130 having bank holes 132 may be formed on the lower substrate 101 with the first electrodes 122 formed thereon. For example, the bank insulating film 130 formed of an organic insulating material such as photoacryl may be formed on the entire surface of the lower substrate 101 with the first electrodes 122 formed thereon. Subsequently, the bank insulating film 130 may be patterned by photolithography and etching to form the bank insulating film 130 having bank holes 132 through which the respective first electrodes 122 are exposed.

Figure 3I:
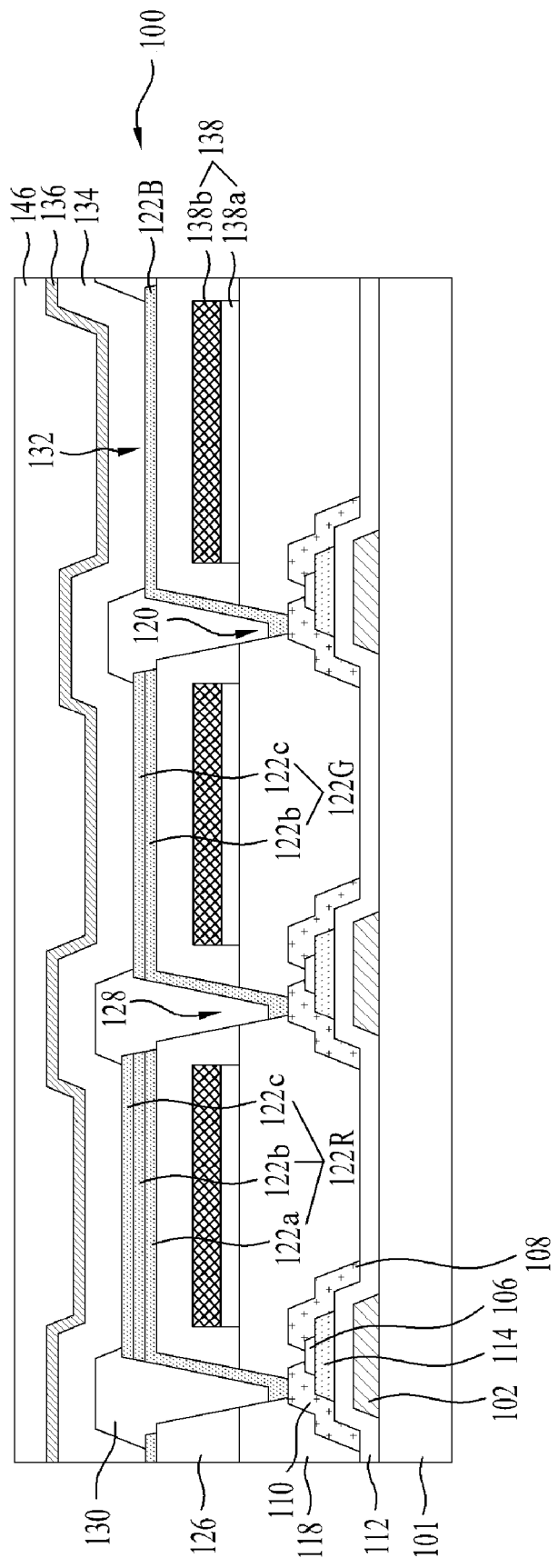

With reference to FIG. 3I, the organic common layer 134 may be formed on the lower substrate 101 with the bank insulating film 130 formed thereon, the second electrode 136 may be formed on the organic common layer 134, and the multi-protective film 146 may be formed on the second electrode 136. For example, the organic common layer 134 may be formed on the first electrodes 122. Then, Al or Ag (for example) may be deposited on the organic common layer 134 to form the second electrode 136. Thereafter, the multi-protective film 146 may be formed on the lower substrate 101 with the second electrode 136 formed thereon, by alternately stacking organic layers and inorganic layers repeatedly.

Figure 3J:
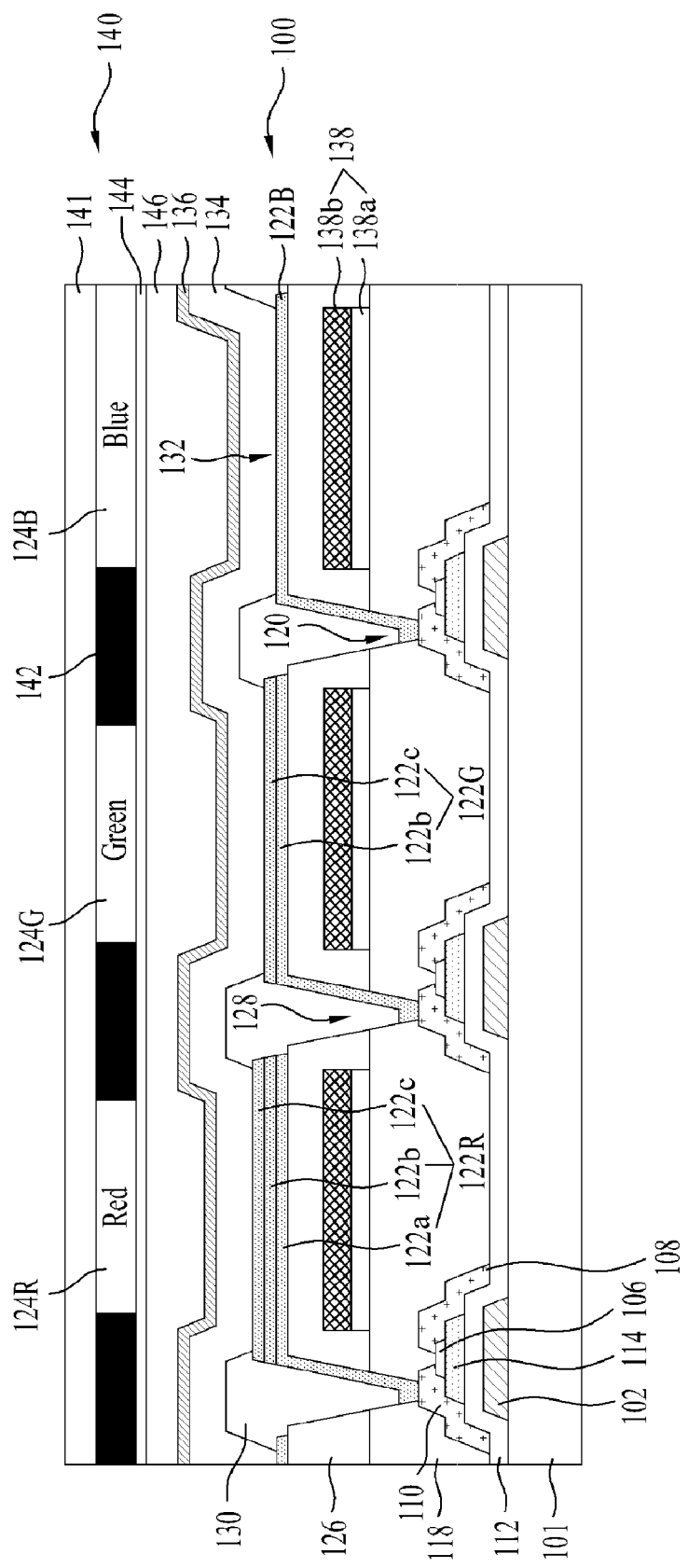

With reference to FIG. 3J, the encapsulation substrate 140 (including the R, G, and B color filters 124R, 124G, 124B) and the black matrices 142 disposed between the R, G, and B color filters 124R, 124G, 124B may be adhered to the multi-protective film 146 via the adhesive resin layer 144.

Figure 4:
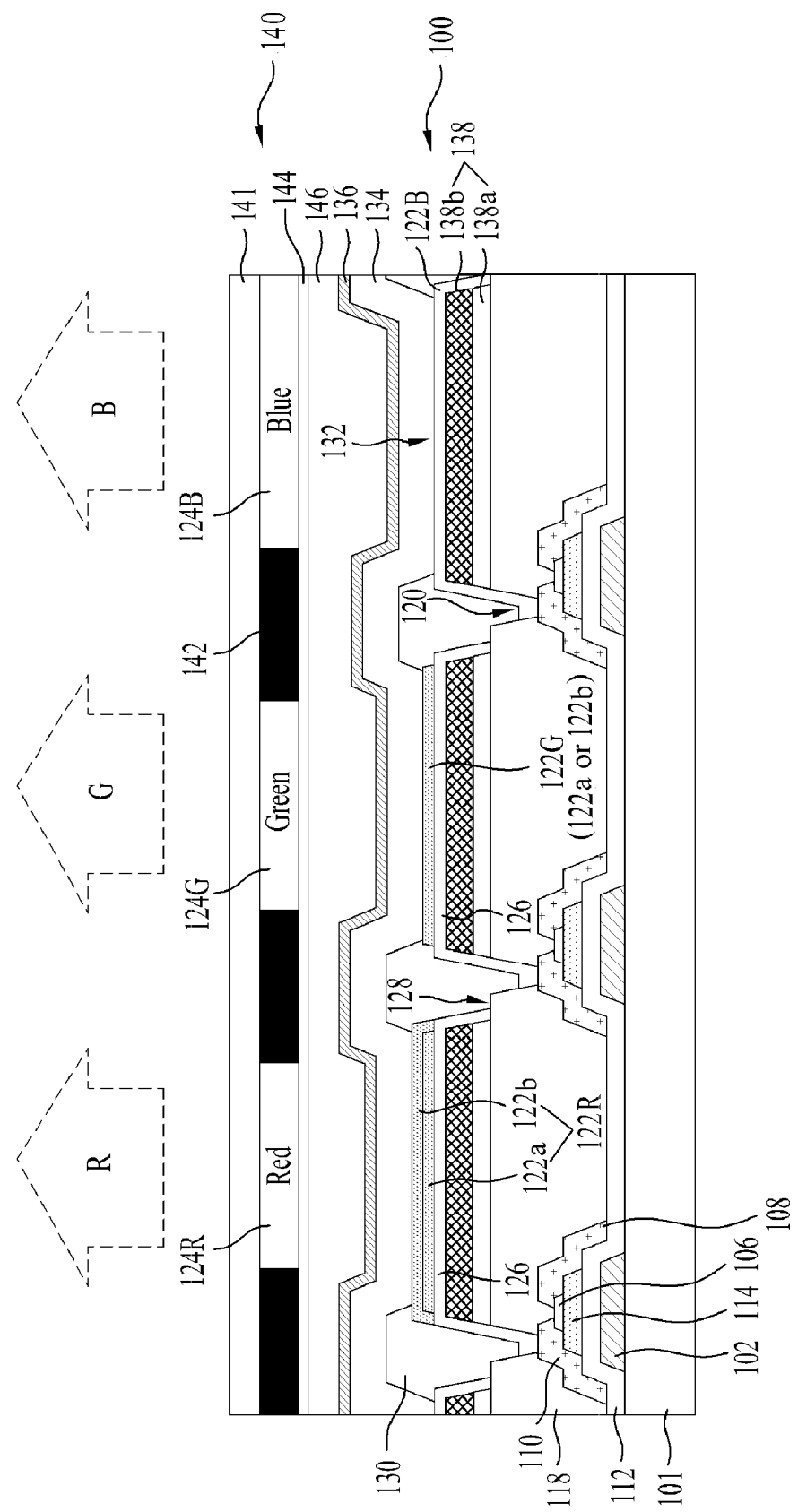
FIG. 4 is a sectional view of an organic light emitting display device according to an embodiment.

FIG. 4 is a sectional view of an organic light emitting display device according to an embodiment. The organic light emitting display device illustrated in FIG. 4 includes similar elements to those of the organic light emitting display device illustrated in FIG. 1, except that the reflective protective film 126 may be formed of a conductive material and may be electrically connected to the reflective electrodes 138.

The reflective protective film 126 may be formed to surround the reflective electrodes 138 and may prevent damage to the reflective electrode 138 by an etchant or etching gas used in an etching process of the first electrode 122. The reflective protective film 126 may be formed of a material having different etching properties than transparent conductive layers of the first electrodes 122 disposed on the reflective protective film 126. For example, the reflective protective film 126 may be formed of either amorphous ITO (IZO) or crystalline ITO (IZO), and the first electrode 122 may be formed of the other thereof.

In this regard, the reflective protective film 126 may be connected to the drain electrodes 110 exposed through the pixel contact holes 120 and may also function as the first electrode 122. For example, the first electrode 122 of the B sub-pixel region may be formed of the same material, at the same layer level, and to the same thickness as the reflective protective film 126.

In addition, the reflective protective film 126 may be formed only within each sub-pixel region and the openings 128 (through which the planarization layer 118 may be exposed) may be formed between portions of the reflective protective film 126. The portions of the reflective protective film 126 of the adjacent sub-pixel regions may be spaced apart from each other via the opening 128, and an electrical short circuit therebetween may be prevented.

The first electrodes 122 as an anode may be formed to different thicknesses in the respective R, G, and B sub-pixel regions. That is, the first electrode 122R of the R sub-pixel region may be formed on the reflective protective film 126 by stacking the first and second transparent conductive layers 122a and 122b to a first thickness (e.g., the thickness of the reflective protective film 126+the thicknesses of the first and second transparent conductive layers 122a and 122b). As the first electrode 122G of the G sub-pixel region, any one of the first and second transparent conductive layers 122a and 122b may be formed on the reflective protective film 126 to a second thickness (e.g., the thickness of the first or second transparent conductive layer 122a or 122b) that may be smaller than the first thickness. The first electrode 122B of the B sub-pixel region may be formed of the same material at the same layer level as the reflective protective film 126 to a third thickness (e.g., the thickness of the reflective protective film 126) that may be smaller than the second thickness. Accordingly, luminous efficiency of each sub-pixel may be optimized due to constructive interference of light emitted from the respective sub-pixels, and power consumption may be reduced.

The first transparent conductive layer 122a may be formed on the reflective protective film 126 to a smaller width than that of the second transparent conductive layer 122b. The second transparent conductive layer 122b of the R sub-pixel region may be formed to surround the first transparent conductive layer 122a. Alternatively, the first transparent conductive layer 122a may have the same width as that of the second transparent conductive layer 122b.

As such, first electrodes of red, green, and blue sub-pixels may be formed to different thicknesses and luminous efficiency may be increased, which may result in reduced power consumption. In addition, a reflective protective film may be formed to surround reflective electrodes and damage to the reflective electrodes may be prevented when etching the first electrodes having a multilayer structure.

Figure 5A:
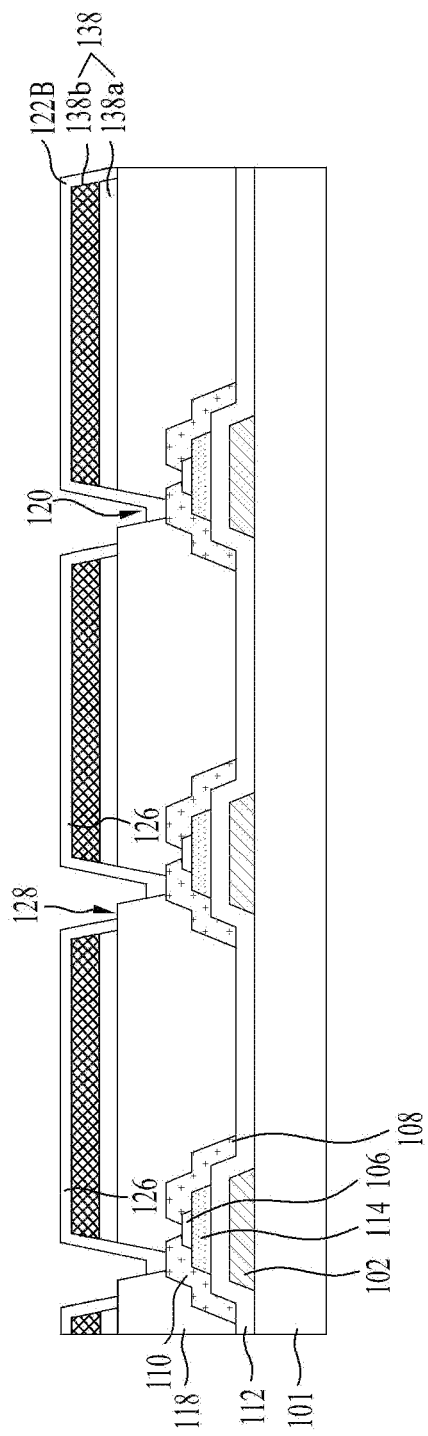
Figure 5B:
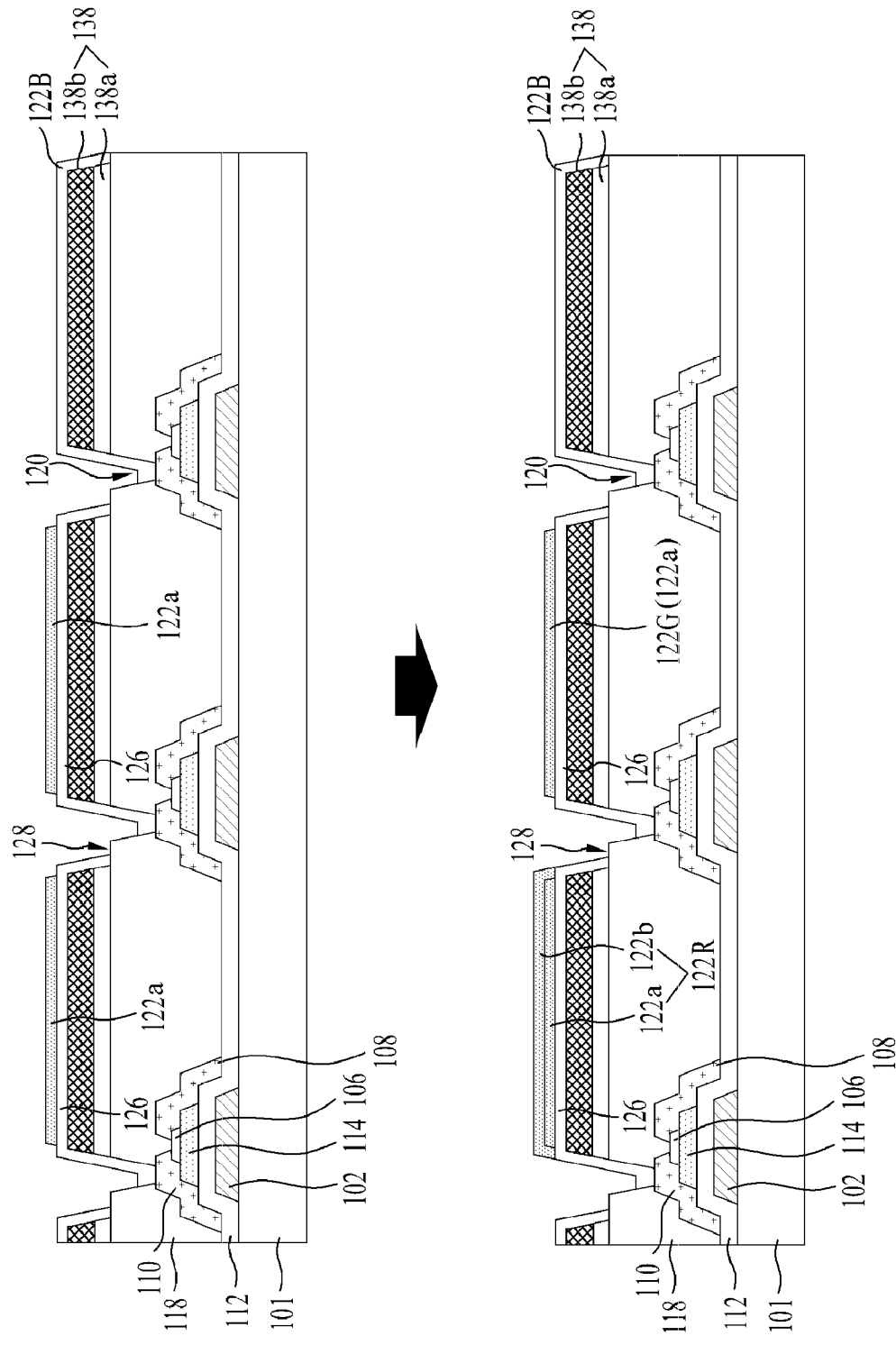

FIGS. 5A to 5C are sectional views illustrating a method of manufacturing the organic light emitting display device according to an embodiment. The manufacturing method of the organic light emitting display device according to the example in FIGS. 5A to 5C is similar to the manufacturing method of the organic light emitting display device according to the example in FIGS. 3A to 3J, except that the reflective protective film 126 and the first electrodes 122 may be manufactured using different methods. Thus, the manufacturing methods of the reflective protective film 126 and the first electrodes 122 will now be described with reference to FIGS. 5A to 5C.

With reference to FIG. 5A, the reflective protective film 126 of the R and G sub-pixel regions and the first electrode 122B of the B sub-pixel region may be formed on the lower substrate 101 with the reflective electrodes 138 formed thereon. For example, a reflective protective material may be deposited over the entire surface of the lower substrate 101 with the reflective electrodes 138 formed thereon. In this regard, the reflective protective material may be, for example, any one of amorphous ITO (IZO) and crystalline ITO (IZO). Thereafter, the reflective protective material may be patterned by photolithography and etching to form the reflective protective film 126 having the openings 128 in the R and G sub-pixel regions and to also form the first electrode 122B of the B sub-pixel region. The reflective protective film 126 may have a greater width than that of the reflective electrode 138 and may be formed to surround front and side surfaces of each reflective electrode 138. In addition, the reflective protective film 126 may be connected to the drain electrode 110 via the pixel contact hole 120. The reflective protective film 126 may have the openings 128 to prevent portions of the reflective protective film 126 of adjacent ones of the sub-pixel regions from electrically contacting each other. Thereafter, as illustrated in FIG. 5B or 5C, the first electrodes 122R and 122G of the respective R and G sub-pixel regions may be formed on the lower substrate 101 with the reflective protective film 126 formed thereon.

First, with reference to FIG. 5B, the other of conductive oxide materials, e.g., amorphous ITO (IZO) and crystalline ITO (IZO), having different etching properties than the reflective protective films 126, may be formed on the lower substrate 101 with the reflective protective film 126 formed thereon, through deposition, such as sputtering or the like. Subsequently, the conductive oxide material may be patterned by photolithography and etching to form the first transparent conductive layer 122a of each of the R and G sub-pixel regions. Thereafter, a conductive oxide material having different etching properties than those of the reflective protective film 126 may be formed on the lower substrate 101 with the first transparent conductive layer 122a of each of the R and G sub-pixel regions. Subsequently, the conductive oxide material may be patterned by photolithography and etching to form the second transparent conductive layer 122b of the R sub-pixel region. Accordingly, the first electrode 122R including the first and second transparent conductive layers 122a and 122b may be formed in the R sub-pixel region, and the first electrode 122G including the first transparent conductive layer 122a may be formed in the G sub-pixel region.

With reference to FIG. 5C, a conductive oxide material having different etching properties than those of the reflective protective films 126 may be formed on the lower substrate 101 with the reflective protective film 126 formed thereon, through deposition, such as sputtering or the like. Subsequently, the conductive oxide material may be patterned by photolithography and etching to form the first transparent conductive layer 122a of the R sub-pixel region. Thereafter, a conductive oxide material having different etching properties than those of the reflective protective film 126 may be formed on the lower substrate 101 with the first transparent conductive layer 122a of the R sub-pixel region formed thereon. Subsequently, the conductive oxide material may be patterned by photolithography and etching to form the second transparent conductive layer 122b of each of the R and G sub-pixel regions. Accordingly, the first electrode 122R including the first and second transparent conductive layers 122a and 122b may be formed in the R sub-pixel region, and the first electrode 122G including the second transparent conductive layer 122b may be formed in the G sub-pixel region.

Meanwhile, the first electrode 122 of the R sub-pixel region, having, e.g., an overall thickness of 1000 to 1500 Å, may be etched several times, for example, three times as in an embodiment, rather than one time, and etching time may be reduced, resulting in increased processes efficiency.

As apparent from the foregoing description, according to the one or more embodiments of an organic light emitting display device and a manufacturing method thereof, R, G, and B sub-pixels may generate white light via a white organic common layer and the white light passes through color filters to realize the corresponding color. Thus, it may be possible to realize high resolution without limitation in resolution of a shadow mask. In addition, first electrodes of the R, G, and B sub-pixels may be formed to different thicknesses and thus luminous efficiency may be enhanced, which may result in reduced power consumption. Moreover, a reflective protective film may be formed to surround reflective electrodes and damage to the reflective electrodes may be prevented when forming first electrodes having a multilayer structure through etching.

The reflective protective film may have a transmissivity of 85% or more at a wavelength of 455 nm.

The reflective protective film may be formed of an inorganic compound such as $SiN_x$ or $SiO_2$, and/or a metallic compound such as $Al_2O_3$.

The reflective protective film may be formed to have openings respectively connected to pixel contact holes and may have the same pattern as that of a planarization layer.

The first electrode of the red sub-pixel region may include first, second, and third transparent conductive layers, the first electrode of the green sub-pixel region may include two of the first, second, and third transparent conductive layers, and the first electrode of the blue sub-pixel region may include one of the first, second, and third transparent conductive layers.

The reflective protective film may include any one of amorphous and crystalline conductive transparent oxides, and the first electrodes may include the other thereof, wherein the conductive transparent oxide is indium tin oxide (ITO) and/or indium zinc oxide (IZO).

In this regard, the reflective protective film may be connected to the drain electrode via each pixel contact hole and may be formed to have openings such that portions of the reflective protective film of adjacent ones of the red, green, and blue sub-pixel regions may be spaced apart from each other.

The first electrode of the red sub-pixel region may include first and second transparent conductive layers, the first electrode of the green sub-pixel region may include any one of the first and second transparent conductive layers, and the first electrode of the blue sub-pixel region may be formed of the same material as that of portions of the reflective protective film of the red and green sub-pixel regions.

Although embodiments have been described with reference to a number of illustrative embodiments thereof, it should be understood that numerous other modifications and embodiments may be devised by those skilled in the art that will fall within the spirit and scope of the principles of this disclosure. For example, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display device, comprising:
a substrate comprising red, green, and blue sub-pixel regions;
reflective electrodes on the substrate;
a reflective protective film on the substrate and surrounding sides and front surfaces of each reflective electrode, the reflective electrodes being on the reflective protective film;
first electrodes on the substrate, the reflective protective film being on the first electrodes, the first electrodes comprising different respective thicknesses in the respective red, green, and blue sub-pixel regions;
a second electrode facing the first electrodes;
an organic common layer configured to emit white light between the first and second electrodes;
thin film transistors respectively connected to each of the first electrodes; and a planarization layer directly covering the thin film transistors, the planarization layer comprising pixel contact holes, each pixel contact hole being configured to expose a drain electrode of its respective thin film transistor,
wherein the reflective protective film comprises openings between the reflective electrodes, and
wherein the reflective protective film comprises the openings respectively connected to the pixel contact holes, such that the openings in the reflective protective film respectively correspond to a same pattern as the pixel contact holes of the planarization layer.

2. The organic light emitting display device of claim 1, wherein the reflective protective film comprises a transmissivity of 85% or more at a wavelength of 455 nm.

3. The organic light emitting display device of claim 2, wherein the reflective protective film comprises an inorganic compound or a compound containing a metallic element.

4. The organic light emitting display device of claim 3, wherein:
the inorganic compound comprises $SiN_x$ or $SiO_2$; and
the compound containing a metallic element comprises $Al_2O_3$.

5. The organic light emitting display device of claim 4, wherein:
the first electrode of the red sub-pixel region comprises first, second, and third transparent conductive layers;
the first electrode of the green sub-pixel region comprises two of the first, second, and third transparent conductive layers; and
the first electrode of the blue sub-pixel region comprises one of the first, second, and third transparent conductive layers.

6. An organic light emitting display device, comprising:
a substrate comprising red, green, and blue sub-pixel regions;

reflective electrodes on the substrate;
a reflective protective film on the substrate and surrounding sides and front surfaces of each reflective electrode, the reflective electrodes being on the reflective protective film;
first electrodes on the substrate, the reflective protective film being on the first electrodes, the first electrodes comprising different respective thicknesses in the respective red, green, and blue sub-pixel regions;
a second electrode facing the first electrodes;
an organic common layer configured to emit white light between the first and second electrodes,
thin film transistors respectively connected to each of the first electrodes; and
a planarization layer directly covering the thin film transistors, the planarization layer comprising pixel contact holes, each pixel contact hole being configured to expose a drain electrode of its respective thin film transistor,
wherein the reflective protective film is connected to the drain electrode via each pixel contact hole, and
wherein the reflective protective film comprises openings configured such that portions of the reflective protective film of adjacent ones of the red, green, and blue sub-pixel regions are spaced apart from each other.

7. The organic light emitting display device of claim 6, wherein:
the reflective protective film comprises any one of amorphous and crystalline conductive transparent oxides;
the first electrodes comprise the other of amorphous and crystalline conductive transparent oxides; and
the conductive transparent oxide comprises indium tin oxide (ITO) or indium zinc oxide (IZO).

8. The organic light emitting display device of claim 6, wherein:
the first electrode of the red sub-pixel region comprises first and second transparent conductive layers;
the first electrode of the green sub-pixel region comprises one of the first and second transparent conductive layers; and
the first electrode of the blue sub-pixel region comprises a same material as that of portions of the reflective protective film of the red and green sub-pixel regions.

9. A method of manufacturing an organic light emitting display device, the method comprising:
forming respective thin film transistors corresponding to red, green, and blue sub-pixel regions;
forming a planarization layer directly covering the thin film transistors, the planarization layer comprising pixel contact holes, each pixel contact hole exposing a drain electrode of its respective thin film transistor;
forming reflective electrodes on a substrate;
forming a reflective protective film on the substrate, the reflective electrodes being formed on the reflective protective film, the reflective protective film surrounding side and front surfaces of each reflective electrode;
forming, on the substrate with the reflective protective film formed thereon, first electrodes comprising different thicknesses in the respective red, green, and blue sub-pixel regions;
forming an organic common layer configured to emit white light on the first electrodes; and
forming a second electrode on the organic common layer,
wherein the reflective protective film comprises openings between the reflective electrodes, and
wherein the reflective protective film is formed to comprise the openings respectively connected to the pixel contact holes, such that the openings in the reflective protective film respectively correspond to a same pattern as the pixel contact holes of the planarization layer.

10. The method of claim 9, wherein the reflective protective film comprises a transmissivity of 85% or more at a wavelength of 455 nm.

11. The method of claim 10, wherein the reflective protective film comprises an inorganic compound or a compound containing a metallic element.

12. The method of claim 11, wherein:
the inorganic compound comprises $SiN_x$ or $SiO_2$; and
the compound containing a metallic element comprises $Al_2O_3$.

13. The method of claim 11, wherein the forming of the first electrodes comprises forming, on the reflective protective film:
a first electrode of the red sub-pixel region comprising first, second, and third transparent conductive layers;
a first electrode of the green sub-pixel region comprising two of the first, second, and third transparent conductive layers; and
a first electrode of the blue sub-pixel region comprising one of the first, second, and third transparent conductive layers.

14. A method of manufacturing an organic light emitting display device, the method comprising:
forming respective thin film transistors corresponding to red, green, and blue sub-pixel regions;
forming a planarization layer directly covering the thin film transistors, the planarization layer comprising pixel contact holes, each pixel contact hole exposing a drain electrode of its respective thin film transistor;
forming reflective electrodes on a substrate;
forming a reflective protective film on the substrate, the reflective electrodes being formed on the reflective protective film, the reflective protective film surrounding side and front surfaces of each reflective electrode;
forming, on the substrate with the reflective protective film formed thereon, first electrodes comprising different thicknesses in the respective red, green, and blue sub-pixel regions;
forming an organic common layer configured to emit white light on the first electrodes;
and
forming a second electrode on the organic common layer,
wherein the reflective protective film is connected to the drain electrode via each pixel contact hole, and
wherein the reflective protective film comprises openings such that portions of the reflective protective film of adjacent ones of the red, green, and blue sub-pixel regions are spaced apart from each other.

15. The method of claim 14, wherein:
the reflective protective film comprises one of amorphous and crystalline conductive transparent oxides;
the first electrodes comprise the other one of amorphous and crystalline conductive transparent oxides; and
the conductive transparent oxide is indium tin oxide (ITO) or indium zinc oxide (IZO).

16. The method of claim 14, wherein the forming of the first electrodes comprises forming, on the reflective protective film:
a first electrode of the red sub-pixel region comprising first and second transparent conductive layers;
a first electrode of the green sub-pixel region comprising one of the first and second transparent conductive layers; and a first electrode of the blue sub-pixel region using a same material as that of portions of the reflective protective film of the red and green sub-pixel regions.

* * * * *